(12) United States Patent
Kim

(10) Patent No.: US 10,630,265 B2
(45) Date of Patent: Apr. 21, 2020

(54) SEMICONDUCTOR DEVICE FOR GENERATING A CONTROL TEMPERATURE CODE

(71) Applicant: SK hynix Inc., Icheon-si Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/171,555

(22) Filed: Oct. 26, 2018

(65) Prior Publication Data

US 2019/0312572 A1  Oct. 10, 2019

(30) Foreign Application Priority Data

Apr. 10, 2018  (KR) .................. 10-2018-0041458

(51) Int. Cl.
| | |
|---|---|
| *H03K 3/00* | (2006.01) |
| *H03K 3/011* | (2006.01) |
| *G11C 7/04* | (2006.01) |
| *H03K 3/037* | (2006.01) |

(52) U.S. Cl.
CPC ............... *H03K 3/011* (2013.01); *G11C 7/04* (2013.01); *H03K 3/037* (2013.01)

(58) Field of Classification Search
CPC ........... H03K 3/011; H03K 3/037; G11C 7/04
USPC ........................................................ 327/199
See application file for complete search history.

(56) References Cited

U.S. PATENT DOCUMENTS

| | | | | |
|---|---|---|---|---|
| 5,336,894 A | * | 8/1994 | Ellers ................ | F41G 7/004 250/504 R |
| 7,916,568 B2 | | 3/2011 | Shirota et al. | |
| 9,514,801 B1 | * | 12/2016 | Lee .................. | G11C 11/40626 |
| 2009/0154279 A1 | * | 6/2009 | Hong ................ | G01K 7/00 365/222 |
| 2016/0091911 A1 | * | 3/2016 | Kim .................. | G05F 1/656 307/117 |
| 2016/0301390 A1 | * | 10/2016 | Park ................. | G11C 7/04 |

FOREIGN PATENT DOCUMENTS

KR  1020160121204 A  10/2016

* cited by examiner

*Primary Examiner* — Ryan Jager
(74) *Attorney, Agent, or Firm* — William Park & Associates Ltd.

(57) ABSTRACT

A semiconductor device includes a control temperature code generation circuit configured to generate latch codes by latching a temperature code until a number of the latch codes generated include a same combination, and configured to update a control temperature code when the number of the latch codes generated include the same.

26 Claims, 11 Drawing Sheets

SEMICONDUCTOR DEVICE FOR GENERATING A CONTROL TEMPERATURE CODE

CROSS-REFERENCE TO RELATED APPLICATION

The present application claims priority under 35 U.S.C. § 119(a) to Korean Patent Application No. 10-2018-0041458 filed on Apr. 10, 2018 in the Korean Intellectual Property Office, which is incorporated herein by reference in its entirety.

BACKGROUND

1. Technical Field

Embodiments of the present disclosure generally relate to a semiconductor device, and more particularly, to a semiconductor device relating to the generation of a control temperature code.

2. Related Art

A semiconductor device such as a DRAM uses a TCSR (temperature-compensated self-refresh) circuit to reduce current consumption. The TCSR circuit is a circuit which changes a self-refresh cycle depending on a temperature in self-refresh and thereby reduces current consumption. That is to say, through using the data retention time of the DRAM, the TCSR circuit increases current consumption by shortening a self-refresh cycle when a temperature is high, and reduces current consumption by lengthening a self-refresh cycle when a temperature is low.

In a digital TCSR circuit among TCSR circuits, a digital thermometer is built in a semiconductor device, and a self-refresh cycle is determined by coding a temperature code generated from the digital thermometer. The performance of the digital thermometer is determined by how much a temperature code outputted matches the internal temperature of the semiconductor device.

SUMMARY

In an embodiment, a semiconductor device may be provided. The semiconductor device may include a latch code generation circuit configured to generate latch codes by latching a temperature code. The semiconductor device may include a period end signal generation circuit configured to generate a period end signal for updating a control temperature code based on the latch codes being the same.

In an embodiment, a semiconductor device may be provided. The semiconductor device may include a control temperature code generation circuit configured to generate latch codes by latching a temperature code, and generate a control temperature code which is updated, based on the latch codes being the same. The semiconductor device may include a code output circuit configured to output the control temperature code as a temperature output code.

In an embodiment, a semiconductor device may be provided. The semiconductor device may include a control temperature code generation circuit configured to generate latch codes by latching, respectively, bits of a temperature code until a number of the latch codes generated include a same combination of bits, and configured to update a control temperature code when the number of the latch codes generated include the same combination of bits.

DETAILED DESCRIPTION

Hereinafter, a semiconductor device will be described below with reference to the accompanying drawings through various examples of embodiments.

For reference, an embodiment including additional components may be provided. Furthermore, a logic high or logic low configuration indicating an enabled or disabled state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to a semiconductor device capable of generating a control temperature code from a temperature code.

According to various embodiments, a temperature code may be latched several times, and, in the case where latched temperature codes are the same, a latched temperature code may be outputted as a control temperature code. Consequently, it may be possible to stably update a control temperature code which may be used in adjusting a refresh cycle.

Figure 1:
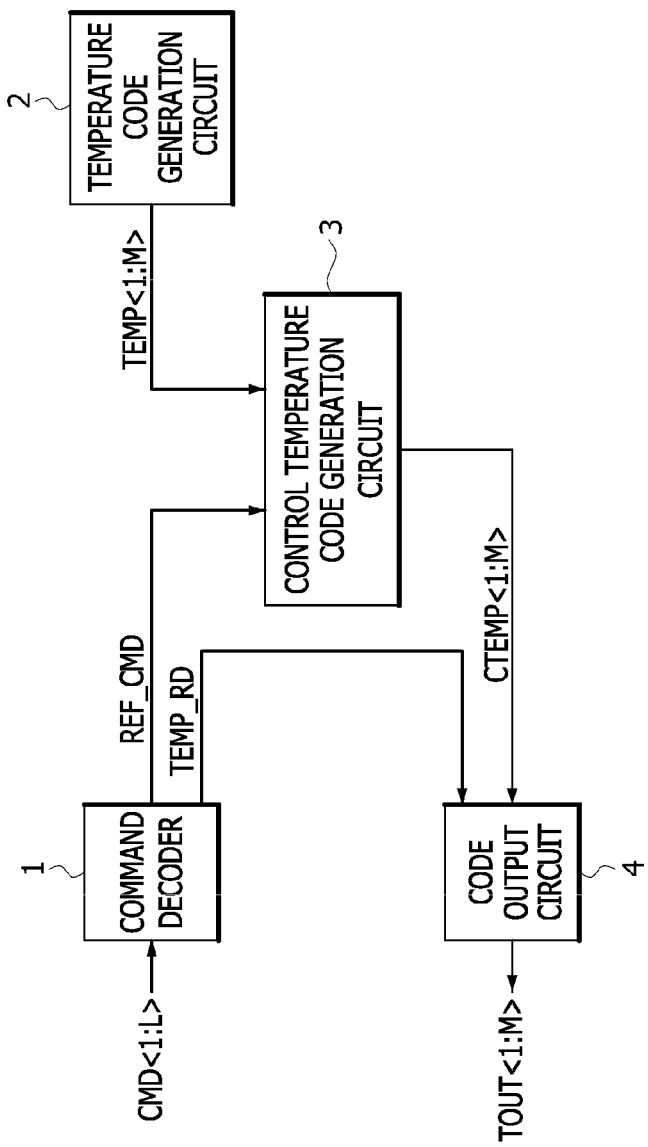
FIG. 1 is a block diagram illustrating a representation of an example of the configuration of a semiconductor device in accordance with an embodiment.

As illustrated in FIG. 1, a semiconductor device in accordance with an embodiment may include a command decoder 1, a temperature code generation circuit 2, a control temperature code generation circuit 3 and a code output circuit 4.

The command decoder 1 may decode a command CMD<1:L> and generate a refresh command REF_CMD and a temperature read command TEMP_RD. The command CMD<1:L> may be inputted from outside the semiconductor device. The number L of the bits included in the command CMD<1:L> may be set variously depending on an embodiment. The command decoder 1 may generate the refresh command REF_CMD in the case where the bits included in the command CMD<1: L> are inputted in a preset logic level combination. The preset logic level combination of the bits included in the command CMD<1:L>, capable of generating the refresh command REF_CMD, may be set variously depending on an embodiment. The command decoder 1 may generate the temperature read command TEMP_RD in the case where the bits included in the command CMD<1:L> are inputted in a preset logic level combination. The preset logic level combination of the bits included in the command CMD<1:L>, capable of generating the temperature read command TEMP_RD, may be set variously depending on an embodiment.

The temperature code generation circuit 2 may measure a temperature inside the semiconductor device, and may generate a temperature code TEMP<1:M> including bits which have a logic level combination corresponding to the measured temperature. The temperature code generation circuit 2 may be embodied by a digital thermometer such as a TCSR (temperature-compensated self-refresh) circuit and a digital TCSR circuit. The number M of the bits included in the temperature code TEMP<1:M> may be set variously depending on an embodiment.

The control temperature code generation circuit 3 may generate a control temperature code CTEMP<1:M> in response to the refresh command REF_CMD and the temperature code TEMP<1:M>. The control temperature code generation circuit 3 may latch the temperature code TEMP<1:M> each time the refresh command REF_CMD is generated. In the case where the temperature code TEMP<1:M> is latched a preset number of times, the control temperature code generation circuit 3 may generate the control temperature code CTEMP<1:M> by sensing the latched temperature codes TEMP<1:M>. For example, the control temperature code generation circuit 3 may latch the temperature code TEMP<1:M> three times, and, in the case where the temperature codes TEMP<1:M> latched three times are all the same, may output the latched temperature code TEMP<1:M> as the control temperature code CTEMP<1:M>. The control temperature code CTEMP<1:M> may be used in adjusting the refresh cycle of the semiconductor device. According to an embodiment, the control temperature code generation circuit 3 may be set to generate the control temperature code CTEMP<1:M> for controlling an internal operation such as a read operation and a write operation, in response to an internal command which is generated in the internal operation. The configuration and operation of the control temperature code generation circuit 3 will be described below with reference to FIGS. 2 to 9.

Figure 11:
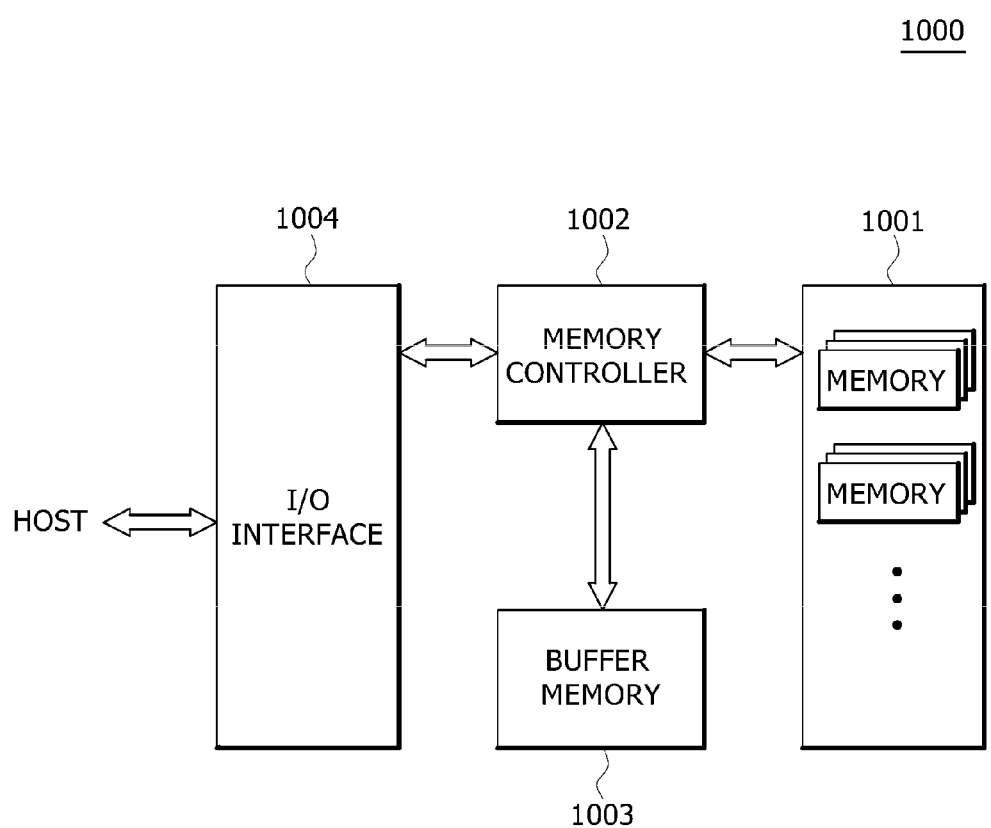
FIG. 11 is a diagram illustrating a representation of an example of the configuration of an electronic system to which the semiconductor device illustrated in FIG. 1 is applied.

The code output circuit 4 may generate a temperature output code TOUT<1:M> from the control temperature code CTEMP<1:M> in response to the temperature read command TEMP_RD. The code output circuit 4 may output the control temperature code CTEMP<1:M> as the temperature output code TOUT<1:M> in the case where the temperature read command TEMP_RD is generated. The temperature output code TOUT<1:M> may be used by being applied to a memory controller (see the reference numeral 1002 of FIG. 11) which controls the semiconductor device.

Figure 2:
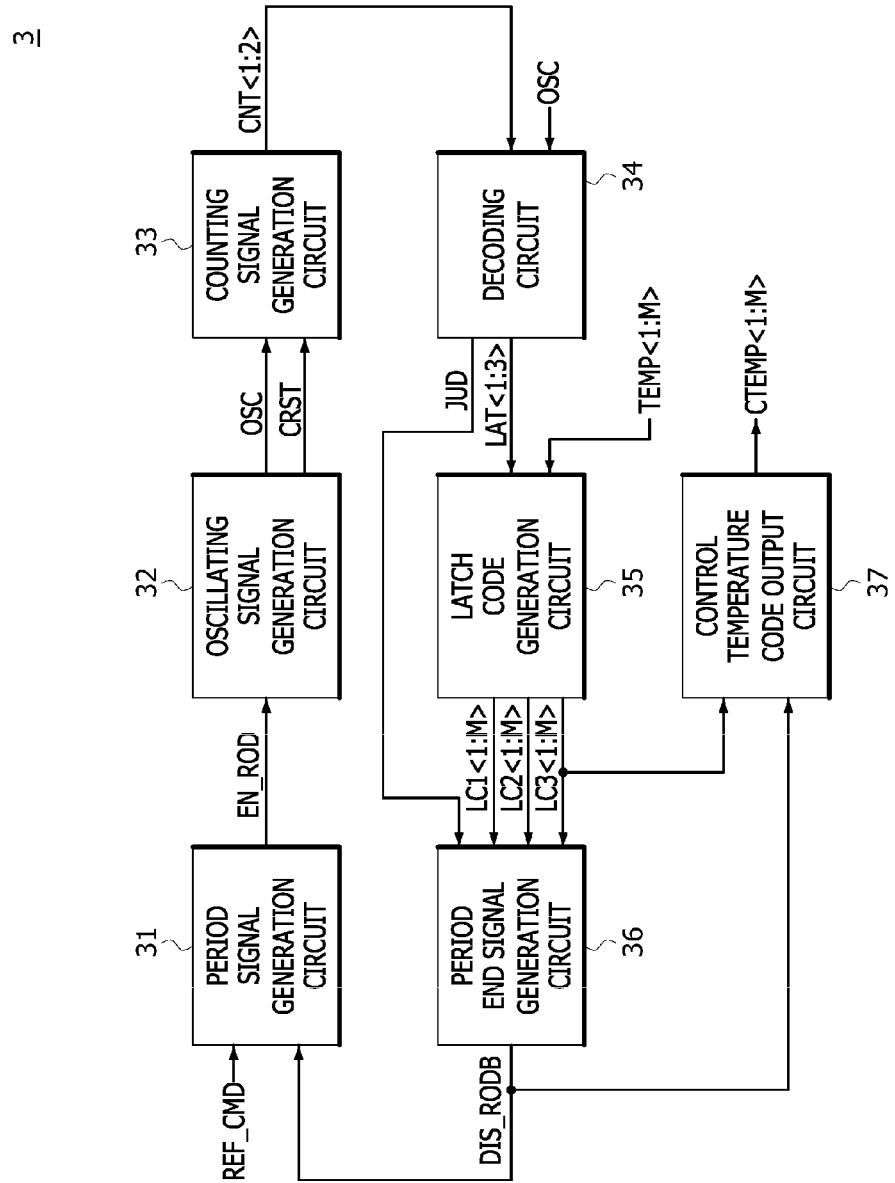
FIG. 2 is a block diagram illustrating a representation of an example of the configuration of the control temperature code generation circuit included in the semiconductor device illustrated in FIG. 1.

Referring to FIG. 2, the control temperature code generation circuit 3 may include a period signal generation circuit 31, an oscillating signal generation circuit 32, a counting signal generation circuit 33, a decoding circuit 34, a latch code generation circuit 35, a period end signal generation circuit 36 and a control temperature code output circuit 37.

The period signal generation circuit 31 may generate a period signal EN_ROD in response to the refresh command REF_CMD and a period end signal DIS_RODB. The period signal generation circuit 31 may enable the period signal EN_ROD in the case where the refresh command REF_CMD is generated. The period signal generation circuit 31 may disable the period signal EN_ROD in the case where the period end signal DIS_RODB is generated. The configuration and operation of the period signal generation circuit 31 will be described later with reference to FIG. 3.

The oscillating signal generation circuit 32 may generate an oscillating signal OSC which has a preset cycle, for a period in which the period signal EN_ROD is enabled. The cycle of the oscillating signal OSC may be set variously depending on an embodiment. The oscillating signal generation circuit 32 may generate a counter reset signal CRST in response to the period signal EN_ROD. The oscillating signal generation circuit 32 may generate the counter reset signal CRST by inverting and buffering the period signal EN_ROD. The configuration and operation of the oscillating signal generation circuit 32 will be described later with reference to FIG. 4.

The counting signal generation circuit 33 may generate a counting signal CNT<1:2> in response to the oscillating signal OSC and the counter reset signal CRST. The counting signal generation circuit 33 may sequentially count the counting signal CNT<1:2> in response to the oscillating signal OSC, For example, the counting signal generation circuit 33 may count the counting signal CNT<1:2> in synchronization with the rising edge of the oscillating signal OSC such that the bits included in the counting signal CNT<1:2> sequentially change in the order of '00,' '01,' '10' and '11.' The case where the bits included in the counting signal CNT<1:2> are '01' means that a first bit CNT<1> included in a counting signal is set to a logic high level and a second bit CNT<2> included in the counting signal is set to a logic low level. The counting signal generation circuit 33 may initialize the counting signal CNT<1:2> in response to the counter reset signal CRST. The counting signal CNT<1:2> may be initialized to various logic level combinations depending on an embodiment. For example, the counting signal CNT<1:2> may be initialized to include bits all of which are set to the logic low level. The configuration and operation of the counting signal generation circuit 33 will be described later with reference to FIG. 5.

The decoding circuit 34 may generate a latch signal LAT<1:3> and a judgment signal JUD in response to the counting signal CNT<1:2> and the oscillating signal OSC. The decoding circuit 34 may generate the latch signal LAT<1:3> and the judgment signal JUD which are generated by being sequentially counted in response to the counting signal CNT<1:2> sequentially counted each time the oscillating signal OSC is generated. The decoding circuit 34 may generate the first bit LAT<1> of a latch signal by the counting signal CNT<1:2> which is set to a first logic level combination, in synchronization with a first oscillating signal OSC. In the present embodiment, the first logic level combination of the counting signal CNT<1:2> may be set to '00.' The decoding circuit 34 may generate the second bit LAT<2> of the latch signal by the counting signal CNT<1:2> which is set to a second logic level combination, in synchronization with a second oscillating signal OSC. In the present embodiment, the second logic level combination of the counting signal CNT<1:2> may be set to '01.' The decoding circuit 34 may generate the third bit LAT<3> of the latch signal by the counting signal CNT<1:2> which is set to a third logic level combination, in synchronization with a third oscillating signal OSC. In the present embodiment, the third logic level combination of the counting signal CNT<1:2> may be set to '10.' The decoding circuit 34 may generate the judgment signal JUD by the counting signal CNT<1:2> which is set to a fourth logic level combination, in synchronization with a fourth oscillating signal OSC. In the present embodiment, the fourth logic level combination of the counting signal CNT<1:2> may be set to '11.' The configuration and operation of the decoding circuit 34 will be described later with reference to FIG. 6.

The latch code generation circuit 35 may generate a first latch code LC1<1:M>, a second latch code LC2<1:M> and a third latch code LC3<1:M> by latching the temperature code TEMP<1:M> in response to the latch signal LAT<1:3>. The latch code generation circuit 35 may latch the temperature code TEMP<1:M> in the case where the first bit LAT<1> of the latch signal is generated, and may output the latched temperature code TEMP<1:M> as the first latch code LC1<1:M>. The latch code generation circuit 35 may latch the temperature code TEMP<1:M> in the case where the second bit LAT<2> of the latch signal is generated, and may output the latched temperature code TEMP<1:M> as the second latch code LC2<1:M>. The latch code generation circuit 35 may latch the temperature code TEMP<1:M> in the case where the third bit LAT<3> of the latch signal is generated, and may output the latched temperature code TEMP<1:M> as the third latch code LC3<1:M>. The configuration and operation of the latch code generation circuit 35 will be described later with reference to FIG. 7.

The period end signal generation circuit 36 may generate the period end signal DIS_RODB in response to the first latch code LC1<1:M>, the second latch code LC2<1:M>, the third latch code LC3<1:M> and the judgment signal JUD. The period end signal generation circuit 36 may generate the period end signal DIS_RODB which is enabled, in the case where the judgment signal JUD is generated in a state in which the first latch code LC1<1:M>, the second latch code LC2<1:M> and the third latch code LC3<1:M> have the same logic level combination. The configuration and operation of the period end signal generation circuit 36 will be described later with reference to FIG. 8.

The control temperature code output circuit 37 may output the control temperature code CTEMP<1:M> by buffering the third latch code LC3<1:M> in the case where the period end signal DIS_RODB is enabled. According to an embodiment, the control temperature code output circuit 37 may output the control temperature code CTEMP<1:M> by buffering the first latch code LC1<1:M> or the second latch code LC2<1:M> in the case where the period end signal DIS_RODB is enabled. The configuration and operation of the control temperature code output circuit 37 will be described later with reference to FIG. 9.

Figure 3:
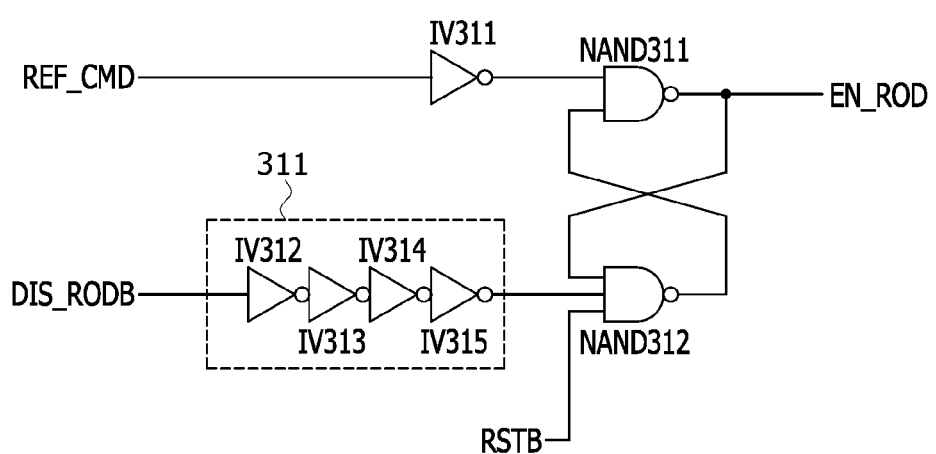
FIG. 3 is a circuit diagram illustrating a representation of an example of the period signal generation circuit included in the control temperature code generation circuit illustrated in FIG. 2.

Referring to FIG. 3, the period signal generation circuit 31 may include an inverter IV311, a delay 311 and NAND gates NAND311 and NAND312. The inverter IV311 may invert and buffer the refresh command REF_CMD, and output an output signal. The delay 311 may include inverters IV312 to IV315, and may receive and delay the period end signal DIS_RODB and output an output signal. The NAND gate NAND311 may receive the output signal of the inverter IV311 and the output signal of the NAND gate NAND312, perform a NAND logic operation, and generate the period signal EN_ROD. The NAND gate NAND312 may receive the output signal of the NAND gate NAND311, the output signal of the delay 311 and a reset signal RSTB, and perform a NAND logic operation. The period signal generation circuit 31 may enable the period signal EN_ROD to a logic high level in the case where the refresh command REF_CMD is generated at a logic high level. The period signal generation circuit 31 may disable the period signal EN_ROD to a logic low level after a preset period elapses in the case where the period end signal DIS_RODB is generated at a logic low level.

Figure 4:
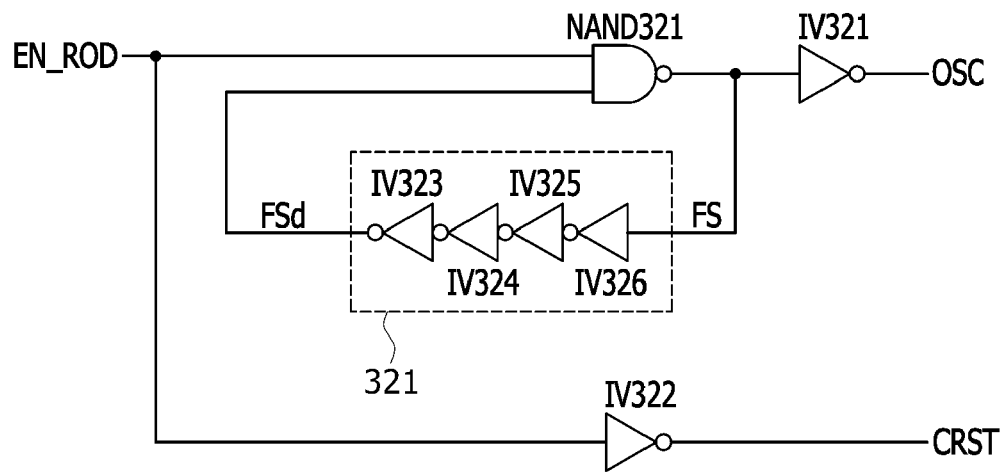
FIG. 4 is a circuit diagram illustrating a representation of an example of the oscillating signal generation circuit included in the control temperature code generation circuit illustrated in FIG. 2.

Referring to FIG. 4, the oscillating signal generation circuit 32 may include a NAND gate NAND321, an inverter IV321, a feedback signal delay circuit 321 and an inverter IV322. The NAND gate NAND321 may receive the period signal EN_ROD and a delayed feedback signal FSd, perform a NAND logic operation, and generate a feedback signal FS. The inverter IV321 may invert and buffer the feedback signal FS, and output the oscillating signal OSC. The feedback signal delay circuit 321 may delay the feedback signal FS by a preset delay period, and generate the delayed feedback signal FSd. The feedback signal delay circuit 321 may delay the feedback signal FS through inverters IV323 to IV326 to generate the delayed feedback signal FSd. The oscillating signal generation circuit 32 may generate the oscillating signal OSC which has a cycle set by the inverters IV323 to IV326, for a period in which the period signal EN_ROD is enabled to the logic high level. The inverter IV322 may invert and buffer the period signal EN_ROD, and generate the counter reset signal CRST.

Figure 5:
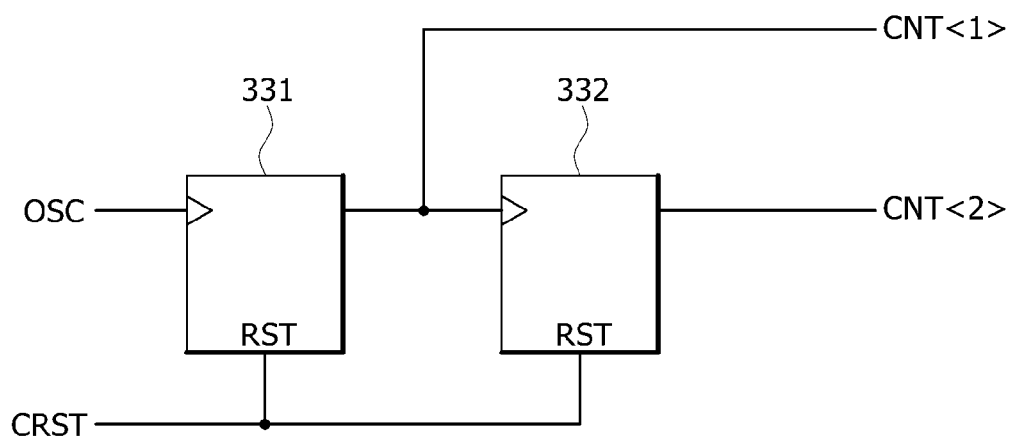
FIG. 5 is a circuit diagram illustrating a representation of an example of the counting signal generation circuit included in the control temperature code generation circuit illustrated in FIG. 2.

Referring to FIG. 5, the counting signal generation circuit 33 may include a first counter 331 and a second counter 332. The first counter 331 may generate the first bit CNT<1> of the counting signal in response to the oscillating signal OSC and the counter reset signal CRST. The first counter 331 may sequentially count the first bit CNT<1> of the counting signal in response to the oscillating signal OSC. The first counter 331 may count the first bit CNT<1> of the counting signal in synchronization with the rising edge of the oscillating signal OSC such that the first bit CNT<1> of the counting signal sequentially changes in the order of '0,' '1,' '0' and '1.' The case where the first bit CNT<1> of the counting signal is '0' means that the first bit CNT<1> included in the counting signal is set to the logic low level, and the case where the first bit CNT<1> of the counting signal is '1' means that the first bit CNT<1> included in the counting signal is set to the logic high level. The first counter 331 may initialize the first bit CNT<1> included in the counting signal, in response to the counter reset signal CRST. The first bit CNT<1> included in the counting signal may be initialized to the logic low level.

The second counter 332 may generate the second bit CNT<2> of the counting signal in response to the first bit CNT<1> included in the counting signal and the counter reset signal CRST. The second counter 332 may sequentially count the second bit CNT<2> of the counting signal in response to the first bit CNT<1> included in the counting signal. The second counter 332 may count the second bit CNT<2> of the counting signal in synchronization with the rising edge of the first bit CNT<1> included in the counting signal such that the second bit CNT<2> of the counting signal sequentially changes in the order of '0,' '1,' '0' and '1.' The case where the second bit CNT<2> of the counting signal is '0' means that the second bit CNT<2> of the counting signal is set to the logic low level, and the case where the second bit CNT<2> of the counting signal is '1' means that the second bit CNT<2> of the counting signal is set to the logic high level. The second counter 332 may initialize the second bit CNT<2> of the counting signal, in response to the counter reset signal CRST. The second bit CNT<2> of the counting signal may be initialized to the logic low level.

The counting signal generation circuit 33 may count the counting signal CNT<1:2> in synchronization with the rising edge of the oscillating signal CSC such that the bits included in the counting signal CNT<1:2> sequentially change in the order of '00,' '01,' '10' and '11.' The counting signal CNT<1:2> may be initialized to include bits all of which are set to the logic low level, in the case where the counter reset signal CRST is enabled to a logic low level.

Figure 6:
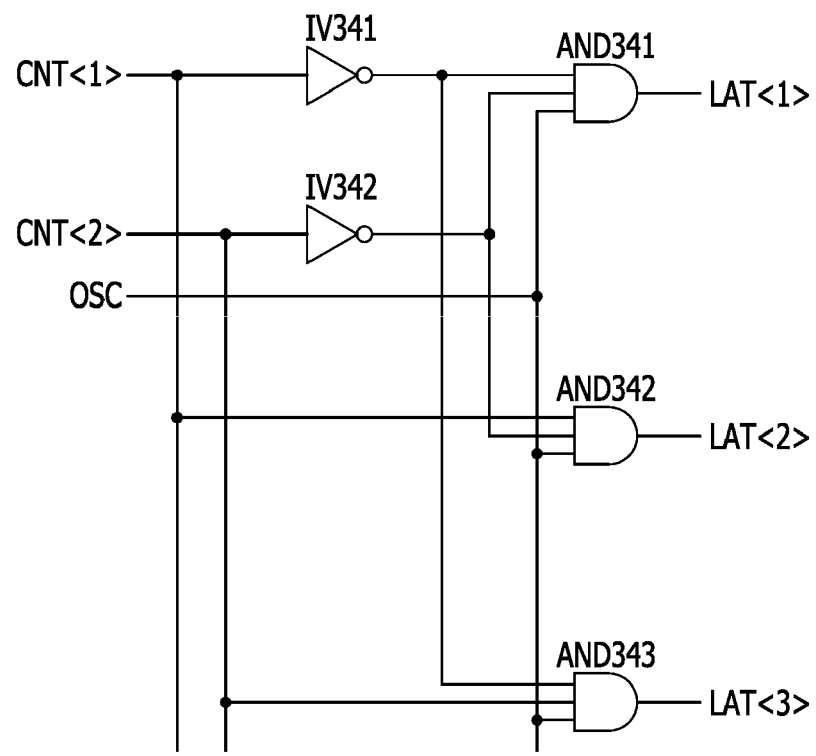
FIG. 6 is a circuit diagram illustrating a representation of an example of the decoding circuit included in the control temperature code generation circuit illustrated in FIG. 2.

Referring to FIG. 6, the decoding circuit 34 may include inverters IV341 and IV342 and AND gates AND341, AND342, AND343 and AND344. The inverter IV341 may invert and buffer the first bit CNT<1> of the counting signal, and output an output signal. The inverter IV342 may invert and buffer the second bit CNT<2> of the counting signal, and output an output signal. The AND gate AND341 may receive the output signal of the inverter IV341 and the output signal of the inverter IV342, perform an AND logic operation, and generate the first latch signal LAT<1>. The AND gate AND342 may receive the first bit CNT<1> of the counting signal and the output signal of the inverter IV342, perform an AND logic operation, and generate the second latch signal LAT<2>. The AND gate AND343 may receive the output signal of the inverter IV341 and the second bit CNT<2> of the counting signal, perform an AND logic operation, and generate the third latch signal LAT<3>. The AND gate AND344 may receive the first bit CNT<1> of the counting signal and the second bit CNT<2> of the counting signal, perform an AND logic operation, and generate the judgment signal JUD.

The decoding circuit 34 may generate the first bit LAT<1> of the latch signal in the case where the counting signal CNT<1:2> which is set to '00' is inputted, in synchronization with the first oscillating signal OSC. The decoding circuit 34 may generate the second bit LAT<2> of the latch signal in the case where the counting signal CNT<1:2> which is set to '01' is inputted, in synchronization with the second oscillating signal OSC. The decoding circuit 34 may generate the third bit LAT<3> of the latch signal in the case where the counting signal CNT<1:2> which is set to '10' is inputted, in synchronization with the third oscillating signal OSC. The decoding circuit 34 may generate the judgment signal JUD in the case where the counting signal CNT<1:2> which is set to '11' is inputted, in synchronization with the fourth oscillating signal OSC.

Figure 7:
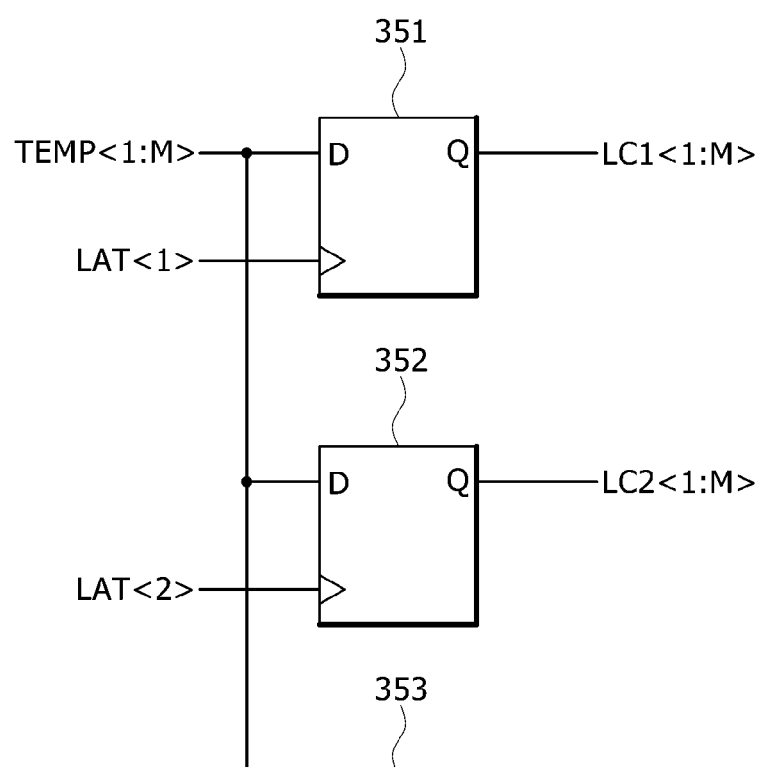
FIG. 7 is a circuit diagram illustrating a representation of an example of the latch code generation circuit included in the control temperature code generation circuit illustrated in FIG. 2.

Referring to FIG. 7, the latch code generation circuit 35 may include a first flip-flop 351, a second flip-flop 352 and a third flip-flop 353. The first flip-flop 351 may latch the temperature code TEMP<1:M> in the case where the first bit LAT<1> of the latch signal is generated at a logic high level, and may output the latched temperature code TEMP<1:M> as the first latch code LC1<1:M>.

The second flip-flop 352 may latch the temperature code TEMP<1:M> in the case where the second bit LAT<2> of the latch signal is generated at a logic high level, and may output the latched temperature code TEMP<1:M> as the second latch code LC2<1:M>. The third flip-flop 353 may latch the temperature code TEMP<1:M> in the case where the third bit LAT<3> of the latch signal is generated at a logic high level, and may output the latched temperature code TEMP<1:M> as the third latch code LC3<1:M>.

Figure 8:
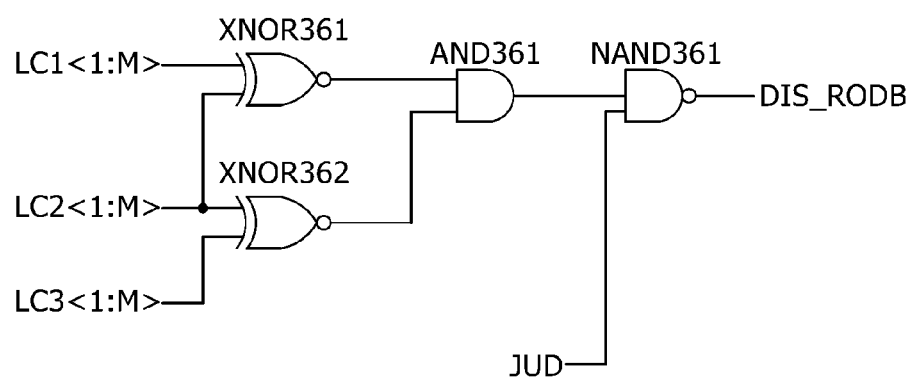
FIG. 8 is a circuit diagram illustrating a representation of an example of the period end signal generation circuit included in the control temperature code generation circuit illustrated in FIG. 2.

Referring to FIG. 8, the period end signal generation circuit 36 may include exclusive NOR gates XNOR361 and XNOR362, an AND gate AND361 and a NAND gate NAND361. The exclusive NOR gate XNOR361 may receive the first latch code LC1<1:M> and the second latch code LC2<1:M>, and perform an XNOR logic operation. The exclusive NOR gate XNOR361 may output a logic high level in the case where the logic level combinations of the first latch code LC1<1:M> and the second latch code LC2<1:M> are the same. The exclusive NOR gate XNOR362 may receive the second latch code LC2<1:M> and the third latch code LC3<1:M>, and perform an XNOR logic operation. The exclusive NOR gate XNOR362 may output a logic high level in the case where the logic level combinations of the second latch code LC2<1:M> and the third latch code LC3<1:M> are the same. The AND gate AND361 may receive the output signal of the exclusive NOR gate XNOR361 and the output signal of the exclusive NOR gate XNOR362, and perform an AND logic operation. The NAND gate NAND361 may receive the output signal of the AND gate AND361 and the judgment signal JUD, perform a NAND logic operation, and generate the period end signal DIS_RODB. In the present embodiment, the first latch code LC1<1:M>, the second latch code LC2<1:M> and the third latch code LC3<1:M> each including a plurality of bits are compared through one exclusive NOR gate. However, according to an embodiment, it may be implemented that the respective bits included in the first latch code LC1<1:M>, the second latch code LC2<1:M> and the third latch code LC3<1:M> are compared through separate exclusive NOR gates.

The period end signal generation circuit 36 may generate the period end signal DIS_RODB which is enabled to the logic low level, in the case where the judgment signal JUD is generated at a logic high level in a state in which the first latch code LC1<1:M>, the second latch code LC2<1:M> and the third latch code LC3<1:M> have the same logic level combination.

Figure 9:
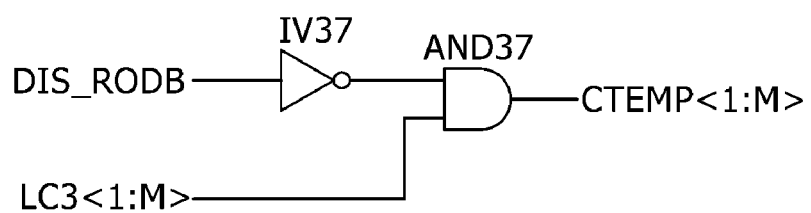
FIG. 9 is a circuit diagram illustrating a representation of an example of the control temperature code output circuit included in the control temperature code generation circuit illustrated in FIG. 2.

Referring to FIG. 9, the control temperature code output circuit 37 may include an inverter IV37 and an AND gate AND37. The inverter IV37 may invert and buffer the period end signal DIS_RODE, and output an output signal. The AND gate AND37 may receive the output signal of the inverter IV37 and the third latch code LC3<1:M>, perform an AND logic operation, and generate the control temperature code CTEMP<1:M>. The control temperature code output circuit 37 may buffer the third latch code LC3<1:M> in the case where the period end signal DIS_RODB is enabled to the logic low level, and output the control temperature code CTEMP<1:M>.

Figure 10:
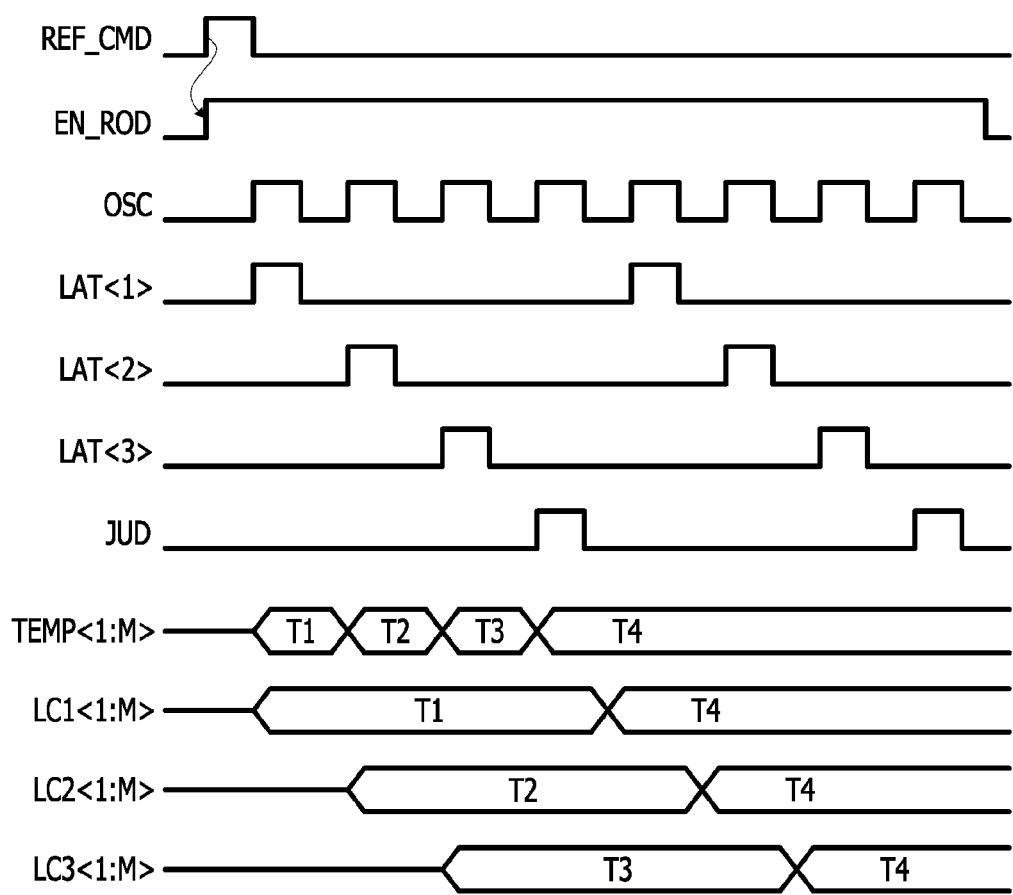
FIG. 10 is a representation of an example of a timing diagram to assist in the explanation of the operation of the semiconductor device illustrated in FIGS. 1 to 9.

The operation of the semiconductor device illustrated in FIGS. 1 to 9 will be described below with reference to FIG. 10.

If the refresh command REF_CMD is generated, the period signal EN_ROD is enabled to the logic high level. The oscillating signal OSC is generated for a period in which the period signal EN_ROD is enabled to the logic high level. The first bit LAT<1> of the latch signal, the second bit LAT<2> of the latch signal, the third bit LAT<3> of the latch signal and judgment signal JUD are sequentially generated each time the oscillating signal OSC is generated. After the judgment signal JUD is generated in synchronization with the oscillating signal OSC, the first bit LAT<1> of the latch signal is generated in synchronization with the oscillating signal OSC.

In the case where the first bit LAT<1> of the latch signal is generated first, the temperature code TEMP<1:M> which has a first logic level combination T1 is latched and is outputted as the first latch code LC1<1:M>. In the case where the second bit LAT<2> of the latch signal is generated first, the temperature code TEMP<1:M> which has a second logic level combination T2 is latched and is outputted as the second latch code LC2<1:M>. In the case where the third bit LAT<3> of the latch signal is generated first, the temperature code TEMP<1:M> which has a third logic level combination T3 is latched and is outputted as the third latch code LC3<1:M. In the case where the judgment signal JUD is generated first, since the first latch code LC1<1:M>, the second latch code LC2<1:M> and the third latch code LC3<1:M> have different logic level combinations, the period end signal DIS_RODB retains a state in which it is disabled to a logic high level.

In the case where the first bit LAT<1> of the latch signal is generated second, the temperature code TEMP<1:M> which has a fourth logic level combination T4 is latched and is outputted as the first latch code LC1<1:M>. In the case where the second bit LAT<2> of the latch signal is generated second, the temperature code TEMP<1:M> which has the fourth logic level combination T4 is latched and is outputted as the second latch code LC2<1:M>. In the case where the third bit LAT<3> of the latch signal is generated second, the temperature code TEMP<1:M> which has the fourth logic level combination T4 is latched and is outputted as the third latch code LC3<1:M>. In the case where the judgment signal JUD is generated second, since all of the first latch code LC1<1:M>, the second latch code LC2<1:M> and the third latch code LC3<1:M> have the same logic level combination, the period end signal DIS_RODB is enabled to the logic low level.

In the case where the period end signal DIS_RODB is enabled to the logic low level, the third latch code LC3<1:M> is buffered and is outputted as the control temperature code CTEMP<1:M>. The period signal EN_ROD is disabled to the logic low level at a time when a preset period elapses from a time when the period end signal DIS_RODB is enabled to the logic low level.

In the semiconductor device in accordance with an embodiment, in the case where a refresh operation is performed, after the temperature code TEMP<1:M> is latched three times, when all of the first latch code LC1<1:M>, the second latch code LC2<1:M> and the third latch code LC3<1:M> are the same, the control temperature code CTEMP<1:M> which is used in adjusting a refresh cycle may be stably updated.

The semiconductor device described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a latch code generation circuit configured to generate latch codes by latching a temperature code in synchronization with a latch signal when an internal operation is performed; and
   a period end signal generation circuit configured to generate a period end signal for updating a control temperature code when the latch codes are the same, wherein bits included in the latch signal are sequentially generated in synchronization with a counting signal which is sequentially counted for a preset period.

2. The semiconductor device according to claim 1, wherein the internal operation is a refresh operation.

3. The semiconductor device according to claim 1, wherein the temperature code includes bits which have a logic level combination corresponding to an internal temperature.

4. The semiconductor device according to claim 1, wherein the latch codes include a first latch code and a second latch code, and the latch code generation circuit generates the first latch code and the second latch code by latching the temperature code in synchronization with the latch signal.

5. The semiconductor device according to claim 4, wherein the latch code generation circuit comprises:
a first flip-flop configured to latch the temperature code in synchronization with a first bit of the latch signal, and output the first latch code; and
a second flip-flop configured to latch the temperature code in synchronization with a second bit of the latch signal, and output the second latch code.

6. The semiconductor device according to claim 1, further comprising:
a period signal generation circuit configured to generate a period signal based on an internal command and the period end signal;
an oscillating signal generation circuit configured to generate an oscillating signal and a counter reset signal based on the period signal;
a counting signal generation circuit configured to generate the counting signal based on the oscillating signal and the counter reset signal; and
a decoding circuit configured to generate the latch signal and a judgment signal based on the oscillating signal and the counting signal.

7. The semiconductor device according to claim 6, wherein the period signal is enabled based on the internal command being generated, and is disabled based on the period end signal being enabled.

8. The semiconductor device according to claim 6, wherein the oscillating signal generation circuit generates the oscillating signal which is generated with a preset cycle for a period in which the period signal is enabled, and generates the counter reset signal by inverting and buffering the period signal.

9. The semiconductor device according to claim 6, wherein the counting signal is sequentially counted in synchronization with the oscillating signal, and is initialized in synchronization with the counter reset signal.

10. The semiconductor device according to claim 6, wherein the decoding circuit sequentially generates bits included in the latch signal and the judgment signal by decoding the counting signal each time the oscillating signal is generated.

11. The semiconductor device according to claim 1, wherein the latch codes include a first latch code and a second latch code, and the period end signal generation circuit generates the period end signal which is enabled, based on a judgment signal being generated in a state in which the first latch code and the second latch code are the same.

12. The semiconductor device according to claim 1, further comprising:

a control temperature code output circuit configured to generate the control temperature code from the latch codes based on the period end signal.

13. A semiconductor device comprising:
a control temperature code generation circuit configured to generate latch codes by latching a temperature code when an internal operation is performed, and generate a control temperature code which is updated, based on the latch codes being the same; and
a code output circuit configured to output the control temperature code as a temperature output code when a temperature read command is generated.

14. The semiconductor device according to claim 13, wherein the code output circuit applies the temperature output code to a memory controller.

15. The semiconductor device according to claim 13, wherein the internal command is generated to perform a refresh operation.

16. The semiconductor device according to claim 13,
wherein the latch codes include a first latch code and a second latch code, and
wherein the control temperature code generation circuit comprises:
a latch code generation circuit configured to generate the first latch code and the second latch code by latching the temperature code based on a latch signal including bits which are sequentially generated when a period signal is enabled based on the internal command.

17. The semiconductor device according to claim 16, wherein the control temperature code generation circuit further comprises:
a period end signal generation circuit configured to generate a period end signal for updating the control temperature code, based on the first latch code and the second latch code being the same.

18. The semiconductor device according to claim 17, wherein the period signal is disabled based on the period end signal.

19. The semiconductor device according to claim 17, wherein the period end signal generation circuit generates the period end signal which is enabled, based on a judgment signal being generated in a state in which the first latch code and the second latch code are the same.

20. A semiconductor device comprising:
a control temperature code generation circuit configured to generate latch codes by latching, respectively, bits of a temperature code until a number of the latch codes generated include a same combination of bits, and configured to update a control temperature code when the number of the latch codes generated include the same combination of bits, wherein the bits of the temperature code are latched in synchronization with latch signals, the latch signals sequentially generated based on an oscillating signal and sequentially counting bits of a counting signal, for a period of the oscillating signal.

21. The semiconductor device according to claim 20, wherein the bits of the temperature code are sequentially latched.

22. The semiconductor device according to claim 20, wherein the latch codes are sequentially generated.

23. The semiconductor device according to claim 20, wherein the latch codes are generated based on an internal operation being performed.

24. The semiconductor device according to claim 23, wherein the internal operation is a refresh operation.

25. The semiconductor device according to claim 20, wherein the control temperature code is used to adjust a refresh cycle of the semiconductor device.

26. The semiconductor device according to claim 20, wherein the bits of the temperature code have a logic level combination corresponding to an internal temperature.

* * * * *